US006650755B2

(12) United States Patent
Vaudrey et al.

(10) Patent No.: US 6,650,755 B2
(45) Date of Patent: Nov. 18, 2003

(54) VOICE-TO-REMAINING AUDIO (VRA) INTERACTIVE CENTER CHANNEL DOWNMIX

(75) Inventors: Michael A. Vaudrey, Blacksburg, VA (US); William R. Saunders, Blacksburg, VA (US)

(73) Assignee: Hearing Enhancement Company, LLC, Roanoke, VA (US)

(*) Notice: Subject to any disclaimer, the term of this patent is extended or adjusted under 35 U.S.C. 154(b) by 0 days.

(21) Appl. No.: 10/178,553

(22) Filed: Jun. 25, 2002

(65) Prior Publication Data

US 2003/0002683 A1 Jan. 2, 2003

Related U.S. Application Data

(63) Continuation of application No. 09/580,203, filed on May 26, 2000.
(60) Provisional application No. 60/139,242, filed on Jun. 15, 1999.

(51) Int. Cl.[7] .......... H04R 5/08; H04R 5/02; H03G 3/00
(52) U.S. Cl. .......... 381/18; 381/300; 381/307; 381/104
(58) Field of Search .......... 381/27, 18–22, 381/104–107, 300, 307

(56) References Cited

U.S. PATENT DOCUMENTS

| | | | |
|---|---|---|---|
| 2,783,677 | A | 3/1957 | Becker |
| 3,046,337 | A | 7/1962 | Hornyak |
| 3,110,769 | A | 11/1963 | Bertram |

(List continued on next page.)

FOREIGN PATENT DOCUMENTS

| | | |
|---|---|---|
| JP | 5342762 | 12/1993 |
| WO | WO 97/37449 | 10/1997 |

OTHER PUBLICATIONS

ATSC Digital Television Standard, ATSC, Sep. 16, 1995, Annex B. Available on–line at www.atsc.org/Standards/A53/.

Guide to the Use of ATSC Digital Television Standard, ATSC, Oct. 4, 1995, pp. 54–59. Available on–line at www.atsc.org/Standards/A54/.

Digital Audio Compression Standard (AC–3), ATSC, Annex C "AC–3 Karaoke Mode", pp. 127–133. Available on–line at www.atsc.org/Standards/A52/.

Shure Incorporated homepage, available on–line at www.shure.com. The Examiner is encouraged to review the entire website for any relevant subject matter.

Digidesign's web page listing of their Aphex Aural Exciter. Available on–line at www.digidesign.com/products/all_prods.php3?location=main&product_id=8. The Examiner is encouraged to review the entire website for any relevant subject matter.

*Primary Examiner*—Forester W. Isen
*Assistant Examiner*—Laura A. Grier
(74) *Attorney, Agent, or Firm*—Kenyon & Kenyon

(57) ABSTRACT

A method for decoding an audio signal includes receiving a digital audio signal having a plurality of channels defined thereon, wherein one of the plurality of channels is a center channel and at least one of the other of said plurality of channels is a remaining audio channel; comparing the center channel with the at least one of the other of the plurality of channels to determine a ratio of the center channel to the other of the plurality of channels; and automatically adjusting the center channel and the at least one of the plurality of other channels when a predetermined value for the ratio is not met.

6 Claims, 6 Drawing Sheets

U.S. PATENT DOCUMENTS 4,024,344 A 5/1977 Dolby et al.
4,051,331 A 9/1977 Strong et al.
4,052,559 A 10/1977 Paul et al.
4,074,084 A 2/1978 VAN DEN Berg
4,150,253 A 4/1979 Knoppel
4,405,831 A 9/1983 Michelson
4,406,001 A 9/1983 Klasco et al.
4,454,609 A 6/1984 Kates
4,484,345 A 11/1984 Stearns
4,516,257 A 5/1985 Torick
4,622,440 A 11/1986 Slavin
4,776,016 A 10/1988 Hansen
4,809,337 A 2/1989 Scholz et al.
4,816,905 A 3/1989 Tweedy et al.
4,868,881 A 9/1989 Zwicker et al.
4,890,170 A 12/1989 Inohana et al.
4,941,179 A 7/1990 Bergenstoff et al.
5,003,605 A 3/1991 Phillipps et al.
5,033,036 A 7/1991 Ohmori et al.
5,113,447 A * 5/1992 Hatley et al. ................. 381/27
5,131,311 A 7/1992 Murakami et al.
5,138,498 A 8/1992 Takigami
5,144,454 A 9/1992 Cury
5,146,504 A 9/1992 Pinckley
5,155,510 A 10/1992 Beard
5,155,770 A 10/1992 Maejima
5,197,100 A 3/1993 Shiraki
5,210,366 A 5/1993 Sykes, Jr.
5,212,764 A 5/1993 Ariyoshi
5,216,718 A 6/1993 Fukuda
5,228,088 A 7/1993 Kane et al.
5,294,746 A 3/1994 Tsumura et al.
5,297,209 A 3/1994 Kowaki
5,319,713 A 6/1994 Waller, Jr. et al.
5,323,467 A 6/1994 Hermes
5,341,253 A 8/1994 Liao et al.
5,384,599 A 1/1995 Casavant et al.
5,395,123 A 3/1995 Kondo
5,396,560 A 3/1995 Arcos et al.
5,400,409 A 3/1995 Linhard
5,408,686 A 4/1995 Mankovitz
5,434,922 A 7/1995 Miller et al.
5,450,146 A 9/1995 Chedeville et al.
5,466,883 A 11/1995 Miyashita et al.
5,469,370 A 11/1995 Ostrover et al.
5,485,522 A 1/1996 Solve et al.
5,497,425 A * 3/1996 Rapoport ....................... 381/1
5,528,694 A * 6/1996 Van De Kerkhof et al. .. 381/22
5,530,760 A 6/1996 Paisley
5,541,999 A 7/1996 Hirai
5,564,001 A 10/1996 Lewis
5,569,038 A 10/1996 Tubman et al.
5,569,869 A 10/1996 Sone
5,572,591 A 11/1996 Numazu et al.
5,576,843 A 11/1996 Cookson et al.
5,619,383 A 4/1997 Ngai
5,621,182 A 4/1997 Matsumoto
5,621,850 A 4/1997 Kane et al.
5,631,712 A 5/1997 Suh et al.
5,644,677 A 7/1997 Park et al.
5,666,350 A 9/1997 Huang et al.
5,668,339 A 9/1997 Shin
5,671,320 A 9/1997 Cookson et al.
5,684,714 A 11/1997 Yogeshwar et al.
5,698,804 A 12/1997 Mizuno
5,703,308 A 12/1997 Tashiro et al.
5,706,145 A 1/1998 Hindman et al.
5,712,950 A 1/1998 Cookson et al.
5,717,763 A 2/1998 Choi et al.
5,727,068 A * 3/1998 Karagosian et al. .......... 381/20
5,732,390 A 3/1998 Katayanagi et al.
5,751,903 A 5/1998 Swaminathan et al.
5,808,569 A 9/1998 Wuppermann et al.
5,812,688 A 9/1998 Gibson
5,820,384 A 10/1998 Tubman et al.
5,822,370 A 10/1998 Graupe
5,850,457 A * 12/1998 Gefvert ....................... 381/18
5,852,800 A 12/1998 Modeste et al.
5,872,851 A 2/1999 Petroff
5,912,976 A * 6/1999 Klayman et al. .............. 381/1
5,991,313 A 11/1999 Tanaka et al.
6,005,948 A * 12/1999 Maeda ....................... 381/119
6,026,168 A * 2/2000 Li et al. ........................ 381/1
6,311,155 B1 * 10/2001 Vaudrey et al. ............... 381/27
6,442,278 B1 * 8/2002 Vaudrey et al. ............... 381/27

* cited by examiner

VOICE-TO-REMAINING AUDIO (VRA) INTERACTIVE CENTER CHANNEL DOWNMIX

CROSS REFERENCE TO RELATED APPLICATION

This application is a continuation of U.S. patent application Ser. No. 09/580,203, filed on May 26, 2000 and claims the benefit of U.S. Provisional patent application Ser. No. 60/139,242 filed on Jun. 15, 1999, both of which are incorporated herein by reference in their entireties.

FIELD OF THE INVENTION

Embodiments of the present invention relate generally to a method and apparatus for processing audio signals, and more particularly, to a method and apparatus for processing audio signals to improve the listening experience for a broad range of end-users.

BACKGROUND OF THE INVENTION

End-users with "high-end" or expensive equipment including multi-channel amplifiers and multi-speaker systems, currently have a limited capability to adjust the volume on the center channel signal of a multi-channel audio system independently of the audio signals on the other remaining channels. Since many movies have mostly dialog on the center channel and other sound effects located on other channels, this limited adjustment capability allows the end-user to raise the amplitude of the mostly dialog channel so that it is more intelligible during sections with loud sound effects. Currently, this limited adjustment has important shortcomings. First, it is an adjustment capability that is only available to the end-users that have a DVD player and a multi-channel speaker system such as a six-speaker home theater system that permits volume level adjustment of all speakers independently. Also, it is an adjustment that will need to be continuously modified during transients in a preferred audio signal (e.g., voice or dialog signal) and remaining audio signal (all other channels). The final shortcoming is that voice-to-remaining audio (VRA) adjustments that were acceptable during one audio segment of the movie program may not be good for another audio segment if the remaining audio level increases too much or the dialog level reduces too much.

It is a fact that a large majority of end-users do not and will not have a home theater that permits this adjustment capability, i.e., Dolby Digital decoder, six-channel variable gain amplifier and multi-speaker system for many years. In addition, the end-users do not have the ability to ensure that the VRA ratio selected at the beginning of the program will stay the same for the entire program.

FIG. 3 illustrates the intended spatial positioning setup of a common home theater system. Although there are no written rules for audio production in 5.1 spatial channels, there are industry standards. As used herein, the term "spatial channels" refers to the physical location of an output device (e.g., speakers) and how the sound from the output device is delivered to the end-user. One of these standards is to locate the majority of dialog on the center channel 226. Likewise other sound effects that require spatial positioning will be placed on any of the other four speakers labeled L 221, R 222, Ls 223, and Rs 224 for left, right, left surround and right surround. In addition, to avoid damage to midrange speakers, low frequency effects (LFE) are placed on the 0.1 channel directed toward a subwoofer speaker 225.

Digital audio compression allows the producer to provide the end-user with a greater dynamic range for the audio that was not possible through analog transmission. This greater dynamic range causes most dialog to sound too low in the presence of some very loud sound effects. The following example provides an explanation. Suppose an analog transmission (or recording) has the capability to transmit dynamic range amplitudes up to 95 dB and dialog is typically recorded at 80 dB. Loud segments of remaining audio may obscure the dialog when that remaining audio reaches the upper limit while someone is speaking. However, this situation is exacerbated when digital audio compression allows a dynamic range up to 105 dB. Clearly, the dialog will remain at the same level (80 dB) with respect to other sounds, only now the loud remaining audio can be more realistically reproduced in terms of its amplitude. End-user complaints that dialog levels have been recorded too low on DVDs are very common. In fact, the dialog IS at the proper level and is more appropriate and realistic than what exists for analog recordings with limited dynamic range.

Even for consumers who currently have properly calibrated home theater systems, dialog is frequently masked by the loud remaining audio sections in many DVD movies produced today. A small group of consumers are able to find some improvement in intelligibility by increasing the volume of the center channel and/or decreasing the volume of all of the other channels. However, this fixed adjustment is only acceptable for certain audio passages and it disrupts the levels from the proper calibration. The speaker levels are typically calibrated to produce certain sound pressure level (SPL)s in the viewing location. This proper calibration ensures that the viewing is as realistic as possible. Unfortunately, this means that loud sounds are reproduced very loud. During late night viewing, this may not be desirable. However, any adjustment of the speaker levels will disrupt the calibration.

SUMMARY OF THE INVENTION

A method for decoding an audio signal includes receiving a digital audio signal having a plurality of channels defined thereon, wherein one of the plurality of channels is a center channel and at least one of the other of said plurality of channels is a remaining audio channel; comparing the center channel with the at least one of the other of the plurality of channels to determine a ratio of the center channel to the other of the plurality of channels; and automatically adjusting the center channel and the at least one of the plurality of other channels when a predetermined value for the ratio is not met.

DETAILED DESCRIPTION

Figure 1:
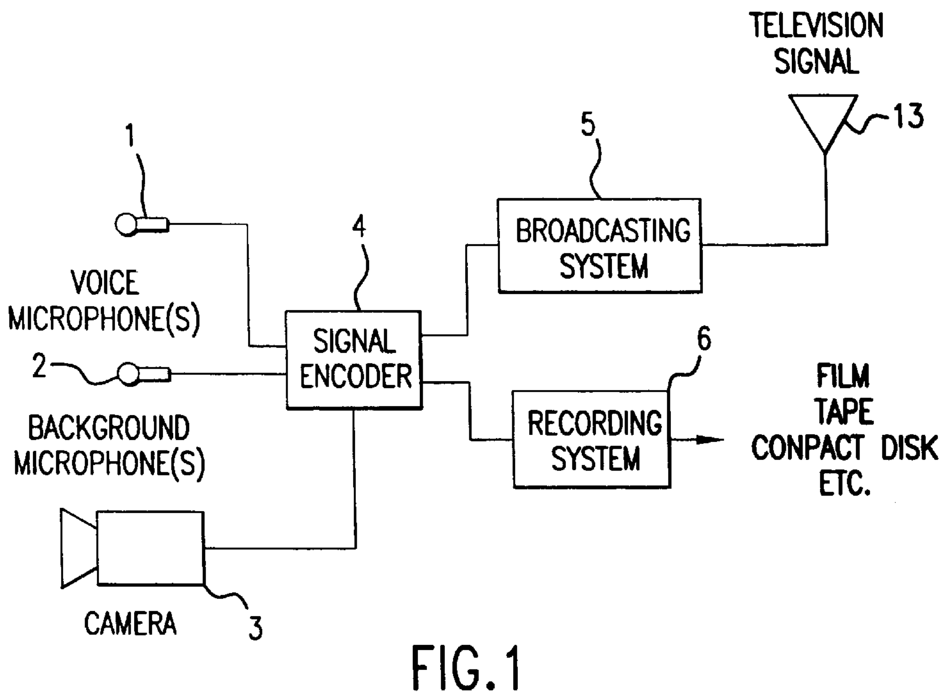
FIG. 1 illustrates a general approach according to the present invention for separating relevant voice information from general background audio in a recorded or broadcast program.

The present invention describes a method and apparatus for adjusting the center channel level of a multi-channel audio program, with respect to the remaining channels of the multi-channel audio program for preferred voice-to-remaining audio capability.

In addition, the present invention describes a method and apparatus for re-recording old masters and recording new masters on audio media in such a manner that allows an end-user to adjust the preferred voice-to remaining audio. As used herein, the term "masters" refers to the audio media generated at the very first step in audio recording process. In addition, the term "end-user" refers to a consumer, or listener of a broadcast or sound recording or a person or persons receiving the audio signal on the audio media that is distributed by recording or broadcast. Furthermore, the term "preferred audio" refers to the voice component, voice information or primary voice component of the audio signal and the term "remaining audio" refers to the background, musical, or non-voice component of the audio signal.

The invention described herein is not limited to any particular audio CODEC (compression/decompression) standard and can be used with any audio CODEC such as Digital Theater Sound (DTS), Dolby Digital, Sony Dynamic Digital Sound (SDDS), Pulse Code Modulation (PCM), etc.

Significance of Ratio of Preferred Audio to Remaining Audio

The present invention begins with the realization that the listening preferential range of a ratio of a preferred audio signal relative to any remaining audio is rather large, and certainly larger than ever expected. This significant discovery is the result of a test of a small sample of the population regarding their preferences of the ratio of the preferred audio signal level to a signal level of all remaining audio.

Specific Adjustment of Desired Range for Hearing Impaired or Normal Listeners Very directed research has been conducted in the area of understanding how normal and hearing impaired end-users perceive the ratio between dialog and remaining audio for different types of audio programming. It has been found that the population varies widely in the range of adjustment desired between voice and remaining audio.

Two experiments have been conducted on a random sample of the population including elementary school children, middle school children, middle-aged citizens and senior citizens. A total of 71 people were tested. The test consisted of asking the end-user to adjust the level of voice and the level of remaining audio for a football game (where the remaining audio was the crowd noise) and a popular song (where the remaining audio was the music). A metric called the VRA (voice-to-remaining audio) ratio was formed by dividing the linear value of the volume of the dialog or voice by the linear value of the volume of the remaining audio for each selection.

Several things were made clear as a result of this testing. First, no two people prefer the identical ratio for voice and remaining audio for both the sports and music media. This is very important since the population has relied upon producers to provide a VRA (which cannot be adjusted by the consumer) that will appeal to everyone. This can clearly not occur, given the results of these tests. Second, while the VRA is typically higher for those with hearing impairments (to improve intelligibility) those people with normal hearing also prefer different ratios than are currently provided by the producers.

It is also important to highlight the fact that any device that provides adjustment of the VRA must provide at least as much adjustment capability as is inferred from these tests in order for it to satisfy a significant segment of the population. Since the video and home theater medium supplies a variety of programming, we should consider that the ratio should extend from at least the lowest measured ratio for any media (music or sports) to the highest ratio from music or sports. This would be 0.1 to 20.17, or a range in decibels of 46 dB. It should also be noted that this is merely a sampling of the population and that the adjustment capability should theoretically be infinite since it is very likely that one person may prefer no crowd noise when viewing a sports broadcast and that another person would prefer no announcement. Note that this type of study and the specific desire for widely varying VRA ratios has not been reported or discussed in the literature or prior art.

In this test, an older group of men was selected and asked to do an adjustment (which test was later performed on a group of students) between a fixed background noise and the voice of an announcer, in which only the latter could be varied and the former was set at 6.00. The results with the older group were as follows:

TABLE I

| Individual | Setting |
|---|---|
| 1 | 7.50 |
| 2 | 4.50 |
| 3 | 4.00 |
| 4 | 7.50 |
| 5 | 3.00 |
| 6 | 7.00 |
| 7 | 6.50 |
| 8 | 7.75 |
| 9 | 5.50 |
| 10 | 7.00 |
| 11 | 5.00 |

To further illustrate the fact that people of all ages have different hearing needs and references, a group of 21 college students was selected to listen to a mixture of voice and background and to select, by making one adjustment to the voice level, the ratio of the voice to the background. The background noise, in this case crowd noise at a football game, was fixed at a setting of six (6.00) and the students were allowed to adjust the volume of the announcers' play by play voice which had been recorded separately and was pure voice of mostly pure voice. In other words, the students were selected to do the same test the group of older men did. Students were selected so as to minimize hearing infirmities caused by age. The students were all in their late teens of early twenties. The results were as follows:

TABLE II

| Student | Setting of Voice |
|---|---|
| 1 | 4.75 |
| 2 | 3.75 |
| 3 | 4.25 |
| 4 | 4.50 |
| 5 | 5.20 |
| 6 | 5.75 |
| 7 | 4.25 |
| 8 | 6.70 |
| 9 | 3.25 |
| 10 | 6.00 |
| 11 | 5.00 |
| 12 | 5.25 |
| 13 | 3.00 |
| 14 | 4.25 |
| 15 | 3.25 |
| 16 | 3.00 |
| 17 | 6.00 |
| 18 | 2.00 |
| 19 | 4.00 |
| 20 | 5.50 |
| 21 | 6.00 |

The ages of the older group (as seen in Table I) ranged from 36 to 59 with the preponderance of the individuals being in the 40 or 50 year old group. As is indicated by the test results, the average setting tended to be reasonably high indicating some loss of hearing across the board. The range again varied from 3.00 to 7.75, a spread of 4.75, which confirmed the findings of the range of variance in people's preferred listening ratio of voice to background or any preferred signal to remaining audio (PSRA). The overall span for the volume setting for both groups of subjects ranged from 2.0 to 7.75. These levels represent the actual values on the volume adjustment mechanism used to perform this experiment. They provide an indication of the range of signal to noise values (when compared to the "noise" level 6.0) that may be desirable from different end-users.

To gain a better understanding of how this relates to relative loudness variations chosen by different end-users, consider that the non-linear volume control variation from 2.00 to 7.75 represents an increase of 20 dB or ten (10) sampling of the population and single type of audio programming it was found that different listeners do prefer quite drastically different levels of "preferred signal" with respect to "remaining audio." This preference cuts across age groups showing that it is consistent with individual preference and basic hearing abilities, which was heretofore totally unexpected.

As the test results show, the range that students (as seen in Table II) without hearing infirmities caused by age selected varied considerably from a low setting of 2.00 to a high of 6.70, a spread of 4.70 or almost one half of the total range of from 1 to 10. The test is illustrative of how the "one size fits all" mentality of most recorded and broadcast audio signals falls far short of giving the individual listener the ability to adjust the mix to suit his or her own preferences and hearing needs. Again, the students had a wide spread in their settings as did the older group demonstrating the individual differences in preferences and hearing needs. One result of this test is that hearing preferences is widely disparate.

Further testing has confirmed this result over a larger sample group. Moreover, the results vary depending upon the type of audio. For example, when the audio source was music, the ratio of voice-to-remaining audio varied from approximately zero to about 10, whereas when the audio source was sports programming, the same ratio varied between approximately zero and about 20. In addition, the standard deviation increased by a factor of almost three, while the mean increased by more than twice that of music.

The end result of the above testing is that if one selects a preferred audio to remaining audio ratio and fixes that forever, one has most likely created an audio program that is less than desirable for a significant fraction of the population. And, as stated above, the optimum ratio may be both a short-term and long-term time varying function. Consequently, complete control over this preferred audio to remaining audio ratio is desirable to satisfy the listening needs of "normal" or non-hearing impaired listeners. Moreover, providing the end-user with the ultimate control over this ratio allows the end-user to optimize his or her listening experience.

The end-user's independent adjustment of the preferred audio signal and the remaining audio signal will be the apparent manifestation of one aspect of the present invention. To illustrate the details of the present invention, consider the application where the preferred audio signal is the relevant voice information.

Creation of the Preferred Audio Signal and the Remaining Audio Signal

FIG. 1 illustrates a general approach to separating relevant voice information from general background audio in a recorded or broadcast program. There will first need to be a determination made by the programming director as to the definition of relevant voice. An actor, group of actors, or commentators must be identified as the relevant speakers.

Once the relevant speakers are identified, their voices will be picked up by the voice microphone 1. The voice microphone 1 will need to be either a close talking microphone (in the case of commentators) or a highly directional shot gun microphone used in sound recording. In addition to being highly directional, these microphones 1 will need to be voice-band limited, preferably from 200–5000 Hz. The combination of directionality and bandpass filtering minimize the background noise acoustically coupled to the relevant voice information upon recording. In the case of certain types of programming, the need to prevent acoustic coupling can be avoided by recording relevant voice of dialogue off-line and dubbing the dialogue where appropriate with the video portion of the program. The background microphones 2 should be fairly broadband to provide the full audio quality of background information, such as music.

A camera 3 will be used to provide the video portion of the program. The audio signals (voice and relevant voice) will be encoded with the video signal at the encoder 4. In general, the audio signal is usually separated from the video signal by simply modulating it with a different carrier frequency. Since most broadcasts are now in stereo, one way to encode the relevant voice information with the background is to multiplex the relevant voice information on the separate stereo channels in much the same way left front and right front channels are added to two channel stereo to produce a quadraphonic disc recording. Although this would create the need for additional broadcast bandwidth, for recorded media this would not present a problem, as long as the audio circuitry in the video disc or tape player is designed to demodulate the relevant voice information.

Once the signals are encoded, by whatever means deemed appropriate, the encoded signals are sent out for broadcast by broadcast system 5 over antenna 13, or recorded on to tape or disc by recording system 6. In case of recorded audio video information, the background and voice information could be simply placed on separate recording tracks.

Receiving and Demodulating the Preferred Audio Signal and the Remaining Audio

Figure 2:
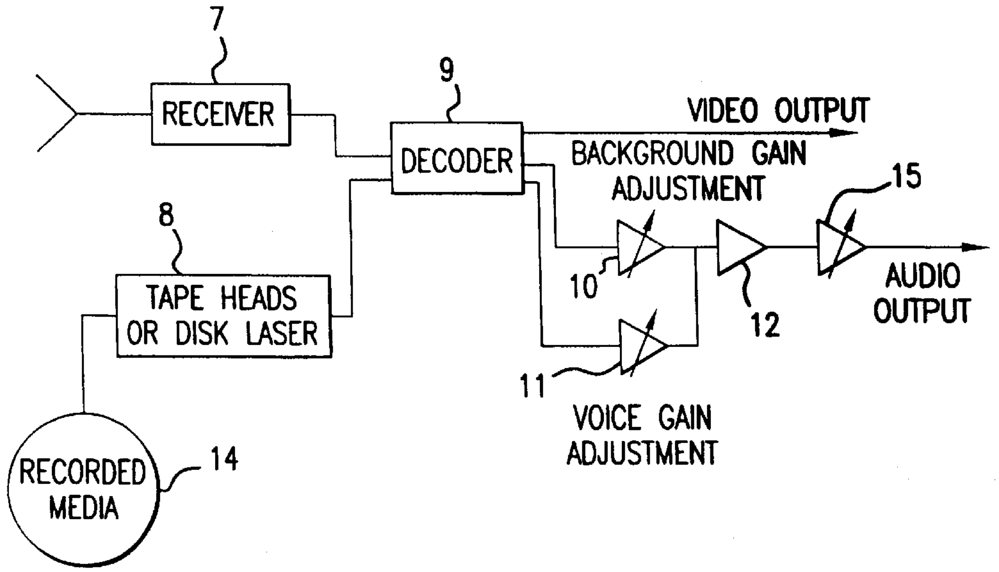
FIG. 2 illustrates an exemplary embodiment according to the present invention for receiving and playing back the encoded program signals.
Figure 3:
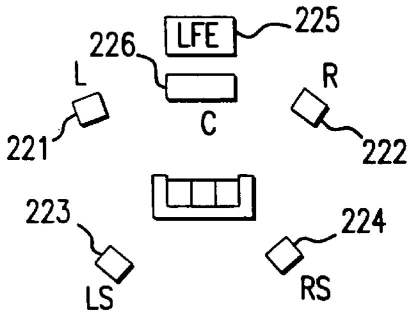
FIG. 3 illustrates the intended spatial positioning setup of a common home theater system.

FIG. 2 illustrates an exemplary embodiment for receiving and playing back the encoded program signals. A receiver system 7 demodulates the main carrier frequency from the encoded audio/video signals, in the case of broadcast information. In the case of recorded media 14, the heads from a VCR or the laser reader from a CD player 8 would produce the encoded audio/video signals.

In either case, these signals would be sent to a decoding system 9. The decoder 9 would separate the signals into video, voice audio, and background audio using standard decoding techniques such as envelope detection in combination with frequency or time division demodulation. The background audio signal is sent to a separate variable gain amplifier 10, that the listener can adjust to his or her preference. The voice signal is sent to a variable gain amplifier 11, that can be adjusted by the listener to his or her particular needs, as discussed above.

The two adjusted signals are summed by a unity gain summing amplifier 12 to produce the final audio output. Alternatively, the two adjusted signals are summed by unity gain summing amplifier 12 and further adjusted by variable gain amplifier 15 to produce the final audio output. In this manner the listener can adjust relevant voice to background levels to optimize the audio program to his or her unique listening requirements at the time of playing the audio program. As each time the same listener plays the same audio, the ratio setting may need to change due to changes in the listener's hearing. The setting remains infinitely adjustable to accommodate this flexibility.

Automatic VRA Adjustment Feature for Center Channel

Some gain of the center channel level or reduction of the remaining speaker levels provides improvement in speech intelligibility for those end-users that have a multi-channel audio system such as a 5.1 channel audio system that has that adjustment capability. Note that all consumers do not have such a system, and the present invention allows all consumers to have that capability.

Figure 4:
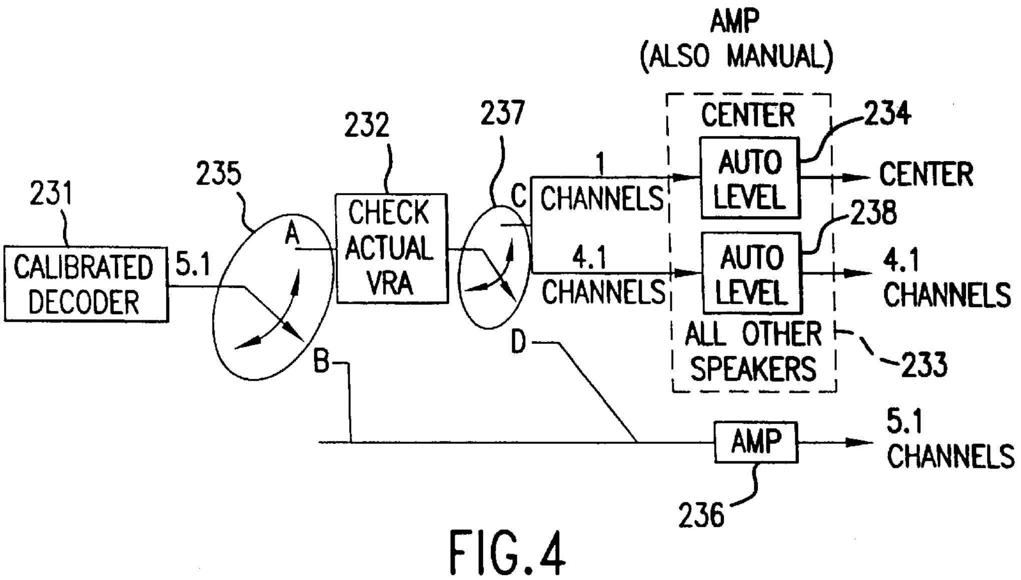
FIG. 4 illustrates a system where the end-user has the option to select the automatic voice-to-remaining audio (VRA) leveling feature or the calibrated audio feature according to the present invention.

FIG. 4 illustrates a system where the end-user has the option to select the automatic VRA leveling feature or the calibrated audio feature. The system includes a calibrated decoder 231, switches 235 and 237, a processor 232 and a plurality of amplifiers 234, 238, and 236. As shown in FIG. 4, the system is calibrated by moving the switch 235 to position B which is considered the normal operating position where all 5.1 decoder output channels go directly to the 5.1 speaker inputs via power amplifier 236. The decoder would then be calibrated so that the speaker levels were appropriate for the home theater system. As mentioned earlier these speaker levels may not be appropriate for nighttime viewing.

Alternatively, switch 235 may be moved to position A which allows the end-user to select a desired VRA ratio and have it automatically maintained by adjusting the relative levels of the center channel with respect to the levels of the other audio channels.

During segments of the audio program that don't violate the end-user selected VRA, the speakers reproduce audio sound in the original calibrated format. The auto-leveling feature only "kicks-in" when the remaining audio becomes too loud or the voice becomes too soft. During these moments, the voice level can be raised, the remaining audio can be lowered, or a combination of both. This is accomplished by the "check actual VRA" processor 232. Check actual VRA processor 232 includes all of the necessary hardware and software and combinations thereof to perform the above mentioned functions. If the end-user selects to have the auto VRA hold feature enabled via switch 235, then the 5.1 channel levels are compared in the check actual VRA block 232. If the average center level is at a sufficient ratio to that of the other channels (which could all be reverse calibrated to match room acoustics and predicted SPL at the viewing location) then the normal calibrated level is reproduced through the amplifier 236 via fast switch 237.

If the ratio is predicted to be objectionable then the fast switch 237 will deliver the center channel to its own auto-level adjustment and all other speakers to their own auto level adjustment.

According to the present invention: 1) those auto VRA-HOLD features are applied directly to the existing 5.1 audio channels; 2) the center level that is currently adjustable in home theaters can be adjusted to a specific ratio with respect to the remaining channels and maintained in the presence of transients; 3) the calibrated levels are reproduced when the end-user selected VRA is not violated and are auto leveled when it is, thereby reproducing the audio in a more realistic manner, but still adapting to transient changes by temporarily changing the calibration; and 4) allowing the end-user to select the auto (or manual) VRA or the calibrated system, thereby eliminating the need for recalibration after center channel adjustment.

Also, note that although the levels are said to be automatically adjusted, that feature can also be disabled to provide a simple manual gain adjustment as shown in FIG. 4.

Center Channel Adjustment for Downmix to Non-center Channel Speaker Arrangements As mentioned above, many end-users do not have home theater systems. However, DVD players are becoming more popular and digital television will be broadcast in the near future. These digital audio formats will require the end-user to have a 5.1 channel decoder in order to listen to any broadcast audio, however, they may not have the luxury of buying a fully adjustable and calibrated home theater system with 5.1 audio channels.

The next aspect of the present invention takes advantage of the fact that producers will be delivering 5.1 channels of audio to end-users who may not have full reproduction capability, while still allowing them to adjust the voice-to-remaining audio VRA ratio level. In addition, this aspect of the present invention is enhanced by allowing the end-user to choose features that will maintain or hold that ratio without having a multi-speaker adjustable system.

Figure 5:
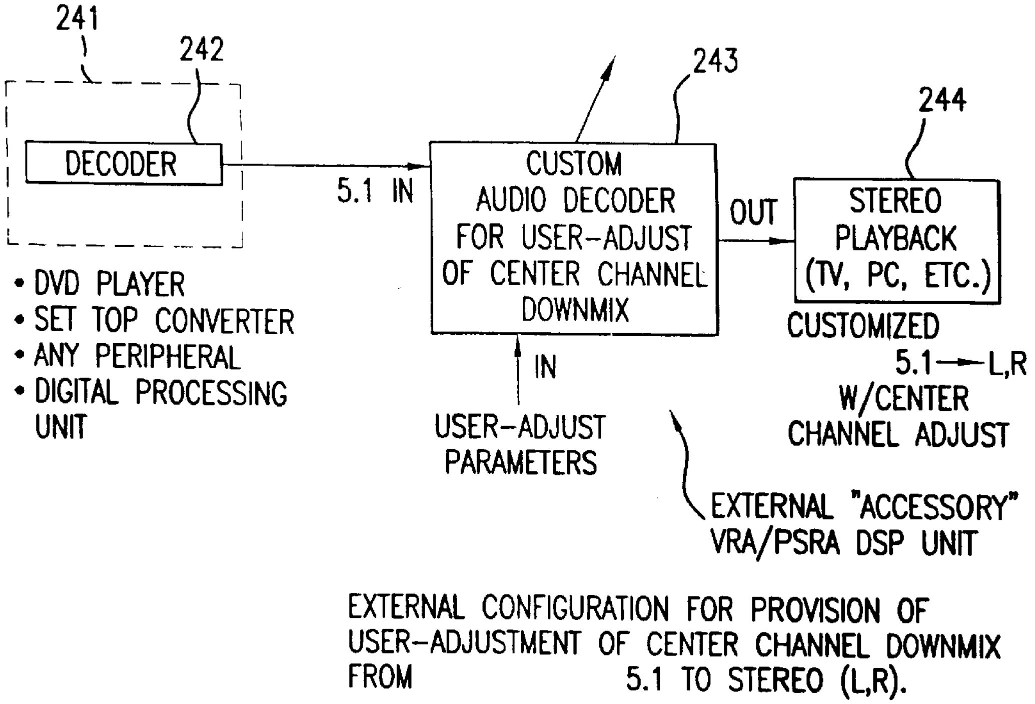
FIG. 5 illustrates an embodiment of one conceptual diagram of how a downmix would be implemented according to the present invention.

FIG. 5 illustrates a conceptual diagram of how a downmix would be implemented according to an embodiment of the present invention. As shown, the downmixing is accomplished by an interfacing unit 241 that receives a 5.1 channel (in this case Dolby Digital) bitstream from the output port of a DVD player, or another similar device 242. The signal is then sent to a custom audio decoder for end-user-adjustment of center channel 243 according to an end-user-selected VRA. The output signal is then sent to a stereo, four-channel, or any other speaker arrangement 244 that does not provide a center channel speaker.

Figure 6:
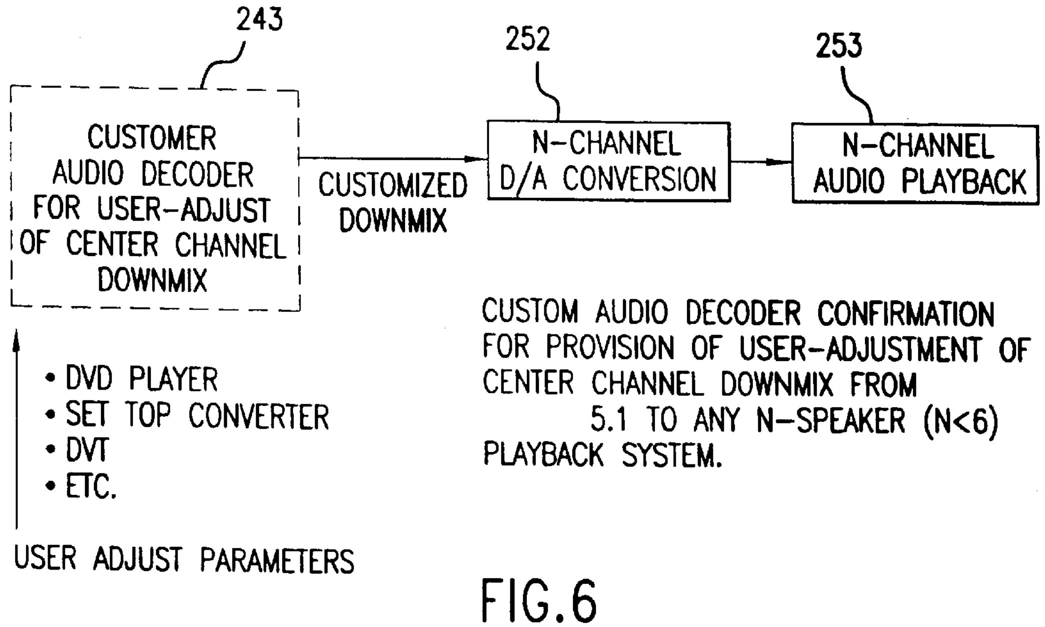
FIG. 6 illustrates an alternative embodiment of a conceptual diagram of how a downmix would be implemented according to the present invention.

FIG. 6 illustrates an alternative embodiment of a conceptual diagram of how a downmix would be implemented according to the present invention. The downmixing for the non-home theater audio systems provides a method for all end-users to benefit from a selectable VRA. The adjusted dialog, is distributed to the non-center channel speakers in such a way as to leave the intended spatial positioning of the audio program as intact as possible. However, the dialog level will simply be higher. As shown, an N-channel D/A converter 252 converts the digital signal from custom audio decoder for end-user-adjust of center channel downmix 243 to an analog signal. The analog signal is then sent to an N-speaker audio playback device 253.

There are well-specified guidelines for downmixing 5.1 audio channels (Dolby Digital) to 4 channels (Dolby Pro-Logic), to 2 channels (stereo), or to 1 channel (mono). The proper combinations of the 5.1 channels at the proper ratios were selected to produce the optimum spatial positioning for whichever reproduction system the consumer has. The problem with the existing methods of downmixing is that they are transparent to and not controllable by the end-user. This can present problems with intelligibility, given the manner in which dynamic range is utilized in the newer 5.1 channel audio mixes.

Figure 7:
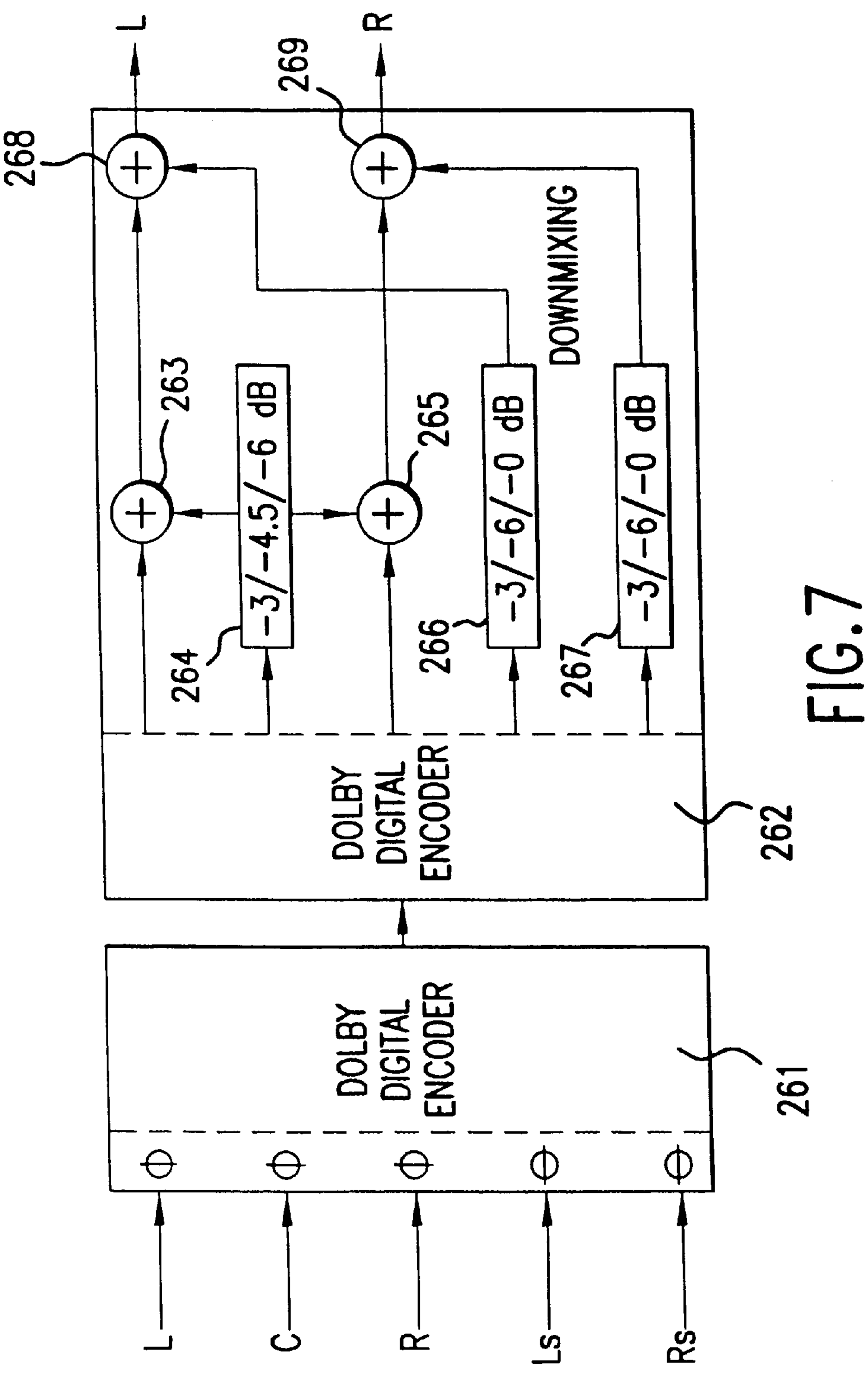
FIG. 7 PRIOR ART
FIG. 7 depicts a Dolby Digital prior art encoder and decoder with standardized downmix coefficients.

As an example, consider a movie that has been produced in 5.1 channels having a segment where the remaining audio masks the dialog making it difficult to understand. If the consumer has 6 speakers and a 6 channel adjustable gain amplifier, speech intelligibility can be improved and maintained as discussed above. However, the consumer that has only stereo reproduction will receive a downmixed version of the 5.1 channels conforming to the diagram shown in FIG. 7 (taken from the Dolby Digital Broadcast Implementation Guidelines). In fact, the center channel level is attenuated by an amount that is specified in the DD bitstream (either −3, −4.5 or −6 dB). This will further reduce intelligibility in segments containing loud remaining audio on the other channels.

This aspect of the present invention circumvents the downmixing process by placing adjustable gain on each of the spatial channels before they are downmixed to the end-users' reproduction apparatus.

Figure 8:
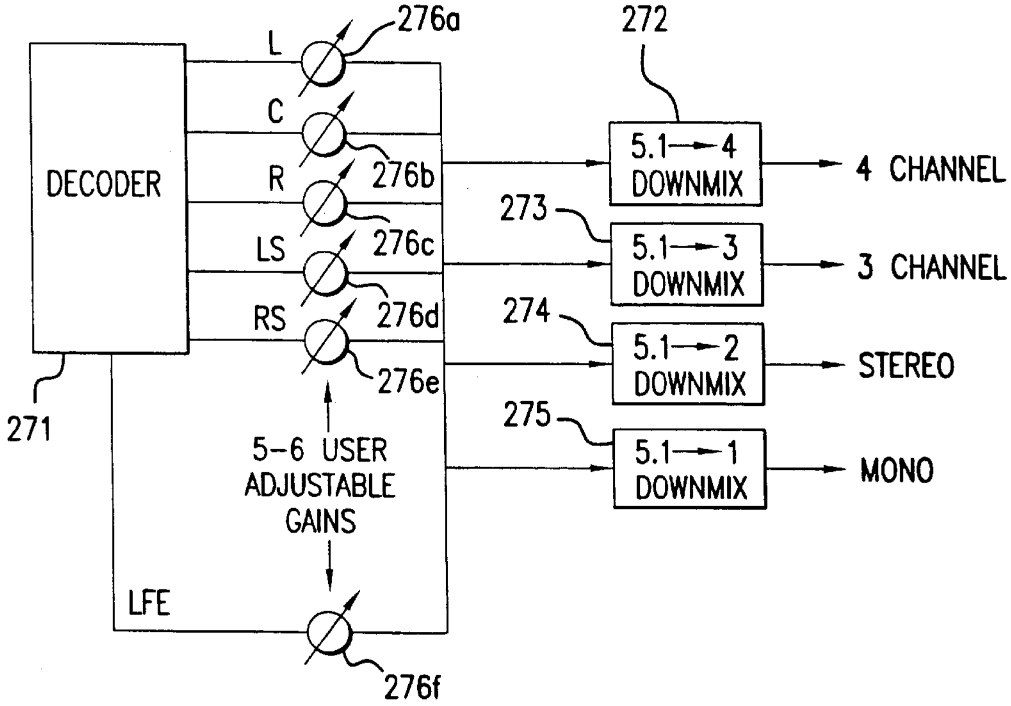
FIG. 8 illustrates the end-user adjustable levels on each of the decoded 5.1 channels according to the present invention.

FIG. 8 illustrates the end-user adjustable levels on each of the decoded 5.1 channels. Typically, downmixing of the low frequency effects (LFE) channel is not done to prevent saturation of electronic components and reduced intelligibility. However, with end-user adjustment available before the downmix occurs, it is possible to include the LFE in the downmix in a ratio specified by the end-user.

Permitting the end-user to adjust the level of each channel (level adjusters 276*a*–*g*) allows end-users having any number of reproduction speakers to take advantage of the voice level adjustment previously only available to those people who had 5.1 reproduction channels.

As shown above, this apparatus can be used external to any decoder 271 whether it is a standalone decoder, inside a DVD, or inside a television, regardless of the number of reproduction channels in the home theater system. The end-user must simply command the decoder 271 to deliver a (5.1) output and the "interface box" will perform the adjustment and downmixing, previously performed by the decoder.

Figure 9:
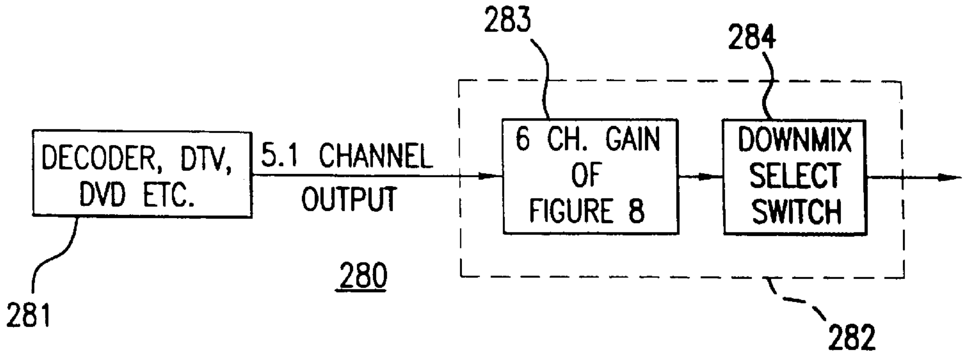
FIG. 9 illustrates an interface box depicted in FIG. 8, according to an embodiment of the present invention.

FIG. 9 illustrates this interface box 282. It can take as its input, the 5.1 decoded audio channels from any decoder, apply independent gain to each channel, and downmix according to the number of reproduction speakers the consumer has.

In addition, this aspect of the present invention can be incorporated into any decoder by placing independent end-user adjustable channel gains on each of the 5.1 channels before any downmixing is performed. The current method is to downmix as necessary and then apply gain. This cannot improve dialog intelligibility because for any downmix situation, the center is mixed into the other channel containing remaining audio.

It should also be noted that the automatic VRA-HOLD mechanisms discussed previously will be very applicable to this embodiment. Once the VRA is selected by adjusting each amplifier gain, the VRA-HOLD feature should maintain that ratio prior to downmixing. Since the ratio is selected while listening to any downmixed reproduction apparatus, the scaling in the downmixing circuits will be compensated for by additional center level adjustment applied by the consumer. So, no additional compensation is necessary as a result of the downmixing process itself.

It should also be noted that bandpass filtering of the center channel before end-user-adjusted amplification and downmixing will remove sounds lower in frequency than speech and sound higher in frequency than speech (200 Hz to 4000 Hz for example) and may improve intelligibility in some passages. It is also very likely that the content removed for improved intelligibility on the center channel, also exists on the left and right channels since they are intended for reproducing music and effects that would otherwise be outside the speech bandwidth anyway. This will ensure that no loss in fidelity of remaining audio sounds occurs while also improving speech intelligibility.

This aspect of the present invention: 1) allows the consumer having any number of speakers to take advantage of the VRA ratio adjustment presently available to those having 5.1 reproduction speakers; 2) allows those same consumers to set a desired level on the center channel with respect to the remaining audio on the other channels, and have that ratio remain the same for transients through the VRA-HOLD feature; and 3) can be applied to any output of any 5.1 channel decoder without modifying the bitstream or increasing required transmission bandwidth, i.e., it is hardware independent.

Three Channel Recording for VRA Reproduction

In order to provide examples of the ideas disclosed herein, it is necessary to choose certain media in certain applications of the media. However, the specific examples do not preclude other forms of media or slightly modified recording techniques from the scope of this invention. In addition, while the focus of this invention is discussed in terms of three channel audio converted to two channel audio, it is not outside the scope of this invention to envision multi-channel recordings produced in such a way that a specific dowmix for the purpose of VRA adjustment is intended.

The goal of the VRA adjustment mechanism is provide the end-user with the ability to separately control the levels of the voice or dialog and remaining audio for purpose of improving intelligibility. The above aspect of present invention discussed above, takes advantage of the fact that many multi-channel productions place the majority of dialog on the center channel. In addition, many end-users do not have the access to the adjustment needed to raise the center channel level on such multi-channel programs. Therefore as stated above, nothing explicitly different is required from the producer in order to provide the end-user with a limited VRA adjustment capability. As discussed below, a production method is disclosed which ensures a more effective VRA adjustment mechanism using the components discussed earlier. In addition, many old audio recordings can be remastered using this new production technique, thus allowing its end-users the means with which to adjust the VRA using the hardware describe above for current 5.1 channel reproductions.

The first example that is used to describe the specifics of this production method is typical popular music. The master recording typically contains a variety of audio tracks which may include drums, guitar, bass and voice. These tracks are, of course, synchronized on a single recording medium so their playback will constitute a complete song. When current CD's (or DVD-audio) discs are produced, these tracks are mixed into a stereo program at the discretion of the producer, with the voice of mixed with the remaining music. With modern stereo production practice, it is impossible for the end-user to have any control over the voice-to-remaining audio ratio. However, if the producer were to place the music mix (non-voiced) as spatially desired on the left and right channels while placing the voice on the center channel, the separate "programs" could be adjusted independently upon playback by the end-user. (This production can be accomplished by using the DVD-audio standard that includes multi-channel programming). Now, if the DVD was produced in this manner (with the music on the left and right and voice on the center), it can be played back by the downmix device discussed above from 5.1 channel to 2 channels, with adjustment on the center channel prior to downmix. This particular embodiment is shown in FIG. 9.

Figure 10:
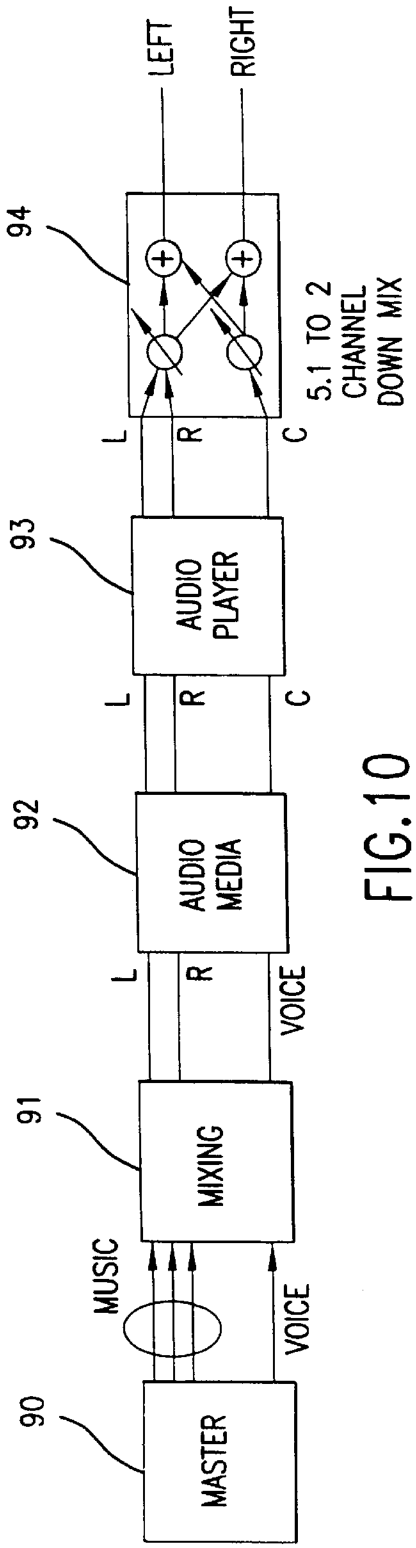
FIG. 10 illustrates the process for placing the music on the left and right channels and voice on the center channel with adjustments on the center channel prior to downmixing.

FIG. 10 illustrates the process for placing the music on the left and right channels and voice on the center channel with adjustments on the center channel prior to downmixing. The process begins with the creation of a master audio program 90 that consists of the voice and remaining audio. The signals from the master audio program 90 are mixed and conditioned equally on the left and right channels as shown in block 91. A three-channel audio media 92 is created such that the left and right audio programs reside on the left and right positions of the audio media, while the voice resides on the center channel of the audio media. The media is produced with the voice level at a standard reproduction level with respect to the total audio level of the rest of the program. This will ensure that upon playback, the end-user can experience the standard mix by setting the voice and remaining audio levels at the same value.

The audio playback device 93 delivers all 5.1 channels of audio to the level adjust/downmix hardware 94 that was described in the previous invention. The downmix can be set to deliver a stereo program from the 5.1 channel audio program. Since the production of most music does not require surround or low frequency effects, the downmix simply combines the adjusted voice level with the left and right music programs for VRA reproduction. This method of producing multi-channel audio relies on the fact that many, if not most, end-users will be downmixing to a fewer number of channels that is more appropriate for the type of programming. Music is an excellent example of this since stereo imaging is typically sufficient for pure audio performances. This method simply takes advantage of the extra space that is available with a higher capacity DVD media in order to place a dialog track suitable for downmixing. This embodiment does not require any changes to the system components mentioned above for center channel level adjustment but utilizes a system component for VRA capability.

Figure 11:
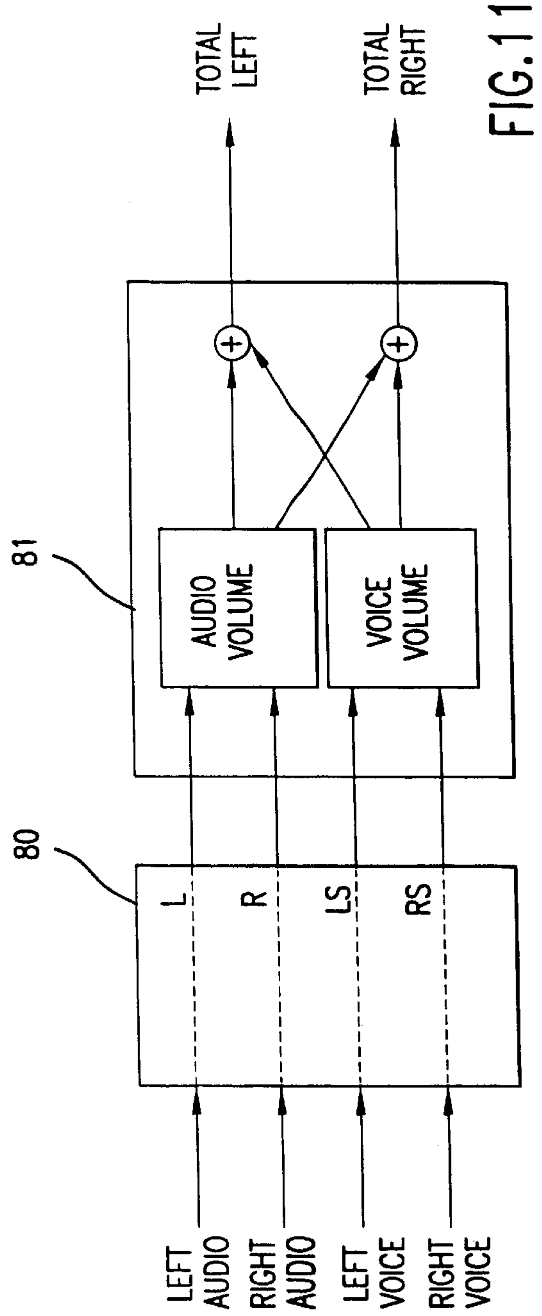
FIG. 11 illustrates an alternative embodiment of the system illustrated in FIG. 10 according to the principles of the present invention.

FIG. 11 illustrates an alternative embodiment of the embodiment described in FIG. 10 and according to the present invention. It may be desirable for producers to produce (and the end-users to experience) voice that is spatially positioned. In order to keep voice and remaining audio separated from each other all the way to the end-user and to have spatial positioning capability, four audio channels must be transmitted to the end-user (for full spatial reproduction). These audio channels include left audio, right audio, left voice and right voice. As shown in FIG. 10, a master has all of the musical and spatial positioning recording complete. A multi-channel recording media is created, such as a 5.1 audio DVD, so that the left audio (without the voice) is on a single channel (such as L), the right audio is on R, the left voice is on the left surround channel and the right voice is on the right surround channel. The use of the surround channels for pure voice is purely arbitrary and any discrete channels can be used for any of the above signals without loss of generality. During the production, and through a standardizing procedure, the placement of each of the audio components will be decided for the type of media; here it is assumed that the left and right voice are on the left and right surround while the left and right audio are on the front left in right channels. FIG. 11 illustrates the special downmix required and how it differs from FIG. 10. There is an audio gain that is supplied to both left and right audio signals and a voice gain that is applied to both left and right voice signals. This permits the required VRA adjustment capability. The left program is then created by combining the left voice and the left audio while the right program is created by combining the right audio and the right voice as shown. As a consequence of the above, a pure stereo program will be delivered while an end-user will still be able to adjust the VRA ratio.

Embodiments of the present invention disclose a method for recording by using multi-channels where the voice should be placed to ensure that downmix techniques are compatible with center channel adjustment system components. It was suggested that the voice be placed on the center channel for downmixing to the stereo playback. This does not preclude the use of other channels for dialogue or for the remaining audio. A similar adjustment and downmix technique is required to recreate the total program with desired spatial positioning, regardless of the channels in which they were originally recorded on. However, if the system components are not designed to accept the predetermined format, the downmix will be incompatible with the production and the end result will be unpredictable. By ensuring that the production is carried out using the center channel as a dedicated dialog channel, end-users can adjust the VRA for any downmix scenario using similar system components. VRA adjustment for a multi-channel voice segment (requiring reproduction on several channels) can still occur for any multi-channel audio format as long as a voice is produced on the DVD separately from the remaining audio. This requires multi-channel production of both voice and remaining audio and will be limited by the number of channels of the audio format being used will permit.

What is claimed is:

1. An apparatus comprising:

a receiver that generates at least four distinct outputs from a received signal, the four outputs comprising a first channel output, a second channel output, a third channel output, and a fourth channel output, wherein the first and second channel outputs comprise voice signals having right and left spatial differentiation, respectively, and the third and forth channel outputs comprise remaining audio signals having right and left spatial differentiation, respectively, wherein the remaining audio signals are signals substantially other than voice signals;

a first volume control having a first input operatively coupled via a first path to a first output, and a second input operatively coupled via a second path to a second output, the first input coupled to the first channel output and the second input coupled to the second channel output, wherein an adjustment of the first volume control causes an equal and simultaneous adjustment to volumes of signals on the first and second paths;

a second volume control having a third input operatively coupled via a third path to a third output, and a fourth input operatively coupled via a fourth path to a fourth output, the third input coupled to the third channel output and the fourth input coupled to the fourth channel output, wherein an adjustment of the second volume control causes an equal and simultaneous adjustment to volumes of signals on the third and fourth paths;

a first summing circuit having at least a first summing input, a second summing input, and a first summing output, the first summing input coupled to the first output, and the second summing input coupled to the third output; and a second summing circuit having at least a third summing input, a fourth summing input, and a second summing output, the third summing input coupled to the second output, and the fourth summing input coupled to the fourth output.

2. The apparatus of claim 1, wherein an adjustment of the first volume control is independent of an adjustment of the second volume control.

3. The apparatus of claim 1, wherein an adjustment of the first volume control is dependent upon an adjustment of the second volume control.

4. The apparatus of claim 3, wherein the dependency is set by a predetermined ratio of the amplitude of the voice signals to the amplitude of the remaining audio signals.

5. The apparatus of claim 1, wherein the amplitudes of the first signal are automatically adjusted to a predetermined ratio of the voice signals to the amplitude of the remaining audio signals.

6. The apparatus of claim 1, further comprising:

a first electro-mechanical transducer coupled to the first summing output; and a second electro-mechanical transducer coupled to the second summing output.

* * * * *